United States Patent [19]
Leowald et al.

[11] 3,987,314
[45] Oct. 19, 1976

[54] CIRCUIT ARRANGEMENT FOR FIRING A CONTROLLED SEMICONDUCTOR VALVE, PARTICULARLY A THYRISTOR

[75] Inventors: Karl-Friedrich Leowald, Weiher; Jakob Schenk, Erlangen, both of Germany

[73] Assignee: Siemens Aktiengesellschaft, Munich, Germany

[22] Filed: Nov. 29, 1974

[21] Appl. No.: 528,493

[30] Foreign Application Priority Data
Dec. 3, 1973 Germany............................ 2360116
Dec. 5, 1973 Germany............................ 2360639

[52] U.S. Cl.............................. 307/252 J; 250/265
[51] Int. Cl.²..................... H03K 17/60; H03K 1/14
[58] Field of Search................ 307/296, 297, 252 N, 307/252 J, 264, 265

[56] References Cited
UNITED STATES PATENTS

| | | | |
|---|---|---|---|
| 3,114,872 | 12/1963 | Allard | 307/296 |
| 3,281,639 | 10/1966 | Potter et al. | 307/296 |
| 3,846,644 | 11/1974 | Takagi et al. | 307/252 J |

*Primary Examiner*—Harold A. Dixon
*Attorney, Agent, or Firm*—Kenyon & Kenyon Reilly Carr & Chapin

[57] ABSTRACT

The invention concerns a circuit arrangement for firing a controlled semiconductor valve, particularly a thyristor, the control path of which is connected to a d-c voltage source by way of the collector-emitter path of a transistor. In order to obtain a control electrode current at the semiconductor valve, which is independent of the d-c voltage of the d-c voltage source and the control electrode characteristic of the semiconductor valve, provision is made, according to the invention, that a resistor is arranged in series with the collector-emitter path of the transistor, and that a Zener diode is connected between the base of the transistor and that terminal of the resistor which is facing away from the transistor.

7 Claims, 9 Drawing Figures

3,987,314

CIRCUIT ARRANGEMENT FOR FIRING A CONTROLLED SEMICONDUCTOR VALVE, PARTICULARLY A THYRISTOR

BACKGROUND OF THE INVENTION

1. Field of the Invention

The invention concerns a circuit arrangement for firing a controlled semiconductor valve, particularly a thyristor (SCR), whose control path is connected to a d-c voltage source by way of the collector-emitter path of a transistor.

2. Description of the Prior Art

A circuit arrangement for firing a controlled semiconductor valve is known, in which a d-c voltage source is connected to the control path of the semiconductor valve via the collector-emitter path of a transistor. The transistor is switched on and off by a control signal, so that the entire d-c voltage of the d-c voltage source is applied to the control path of the semiconductor valve, if required. The transistor functions here as a switching transistor. It can have only two conduction states. The d-c voltage source can be designed so that it obtains the d-c voltage for control from the voltage at the anode-cathode path of the semiconductor valve. Such a d-c voltage source is known, for instance, from the German Pat. No. 1,538,099.

In such a circuit arrangement, the magnitude of the control electrode current which flows into the control path of the semiconductor valve, depends on the magnitude of the d-c voltage of the d-c voltage source. This is also the case in circuit arrangements with a d-c voltage source, in which the d-c voltage delivered is obtained from the voltage at the anode-cathode path of the semiconductor valve to be fired. Therefore, if the d-c voltage varies, the control electrode current varies also. The circuit arrangement must therefore be designed for that lower limit of the control electrode current which still ensures reliable firing. In the time average this means, however, unnecessary energy consumption.

However, the magnitude of the control electrode current depends also on the control electrode characteristic of the semiconductor valve. In the construction of circuit arrangements, the design would therefore have to take into consideration the control electrode characteristic of the semiconductor valve used in every circuit arrangement concerned. In production, however, one seeks to avoid individual adjustments and to achieve cost-saving mass production with identical components.

It is an object of the invention to develop the circuit arrangement mentioned above such that the control electrode current is kept constant independently of the control electrode characteristic of the semiconductor valve and also in the case of fluctuations of the d-c voltage supplied by the d-c voltage source, if present.

SUMMARY OF THE INVENTION

According to the invention, this problem is solved by the provision that a resistor is arranged in series with the collector-emitter path of the transistor, and that a Zener diode is connected between the base of the transistor and that terminal of the resistor which is facing away from the transistor.

In order to obtain more gain, one can design a circuit such that another transistor is connected in cascade with the first transistor, and that the Zener diode is connected between the base of this other transistor and that terminal of the resistor which is facing away from the transistor.

An ohmic resistor can be used as the resistor which is connected in series with the collector-emitter path of the transistor. Alternatively an impedance can be defined which is selected so that the current-time area produced at this resistance in the firing operation of the semiconductor valve can be kept small as compared to that at a purely ohmic resistance. This can be achieved by making the resistance of two ohmic resistances in series, one of which is shunted by a pulse-shaping capacitor. Overall, therefore, one obtains a capacitive impedance.

As a result of this measure, the control grid current does not have rectangular wave shape as in the case when an ohmic resistance is used, but a wave form decaying in time. The current-time area is thereby reduced. If a storage capacitor is contained in the d-c voltage source which supplies the energy for firing the semiconductor valve, for instance, from the reverse voltage of the latter, more firings of the semiconductor valve can be carried out in this manner with a single capacitor charge than when a purely ohmic resistance is used.

A further embodiment of this circuit arrangement with a capacitive impedance achieved where the resistor is shunted by a connection of the pulse-shaping capacitor in series with a diode poled in the flow direction of the control electrode current, and that a further ohmic resistor is connected parallel to the pulse-shaping capacitor.

The values of the resistors should be selected so that the resistance ratio of the resistor shunted by the pulse-shaping capacitor to the resistor connected in series with it is about 3:1. The resistance ratio of the further resistor to be shunted resistor should, furthermore, be 10:1.

DESCRIPTION OF THE INVENTION

Figure 1:
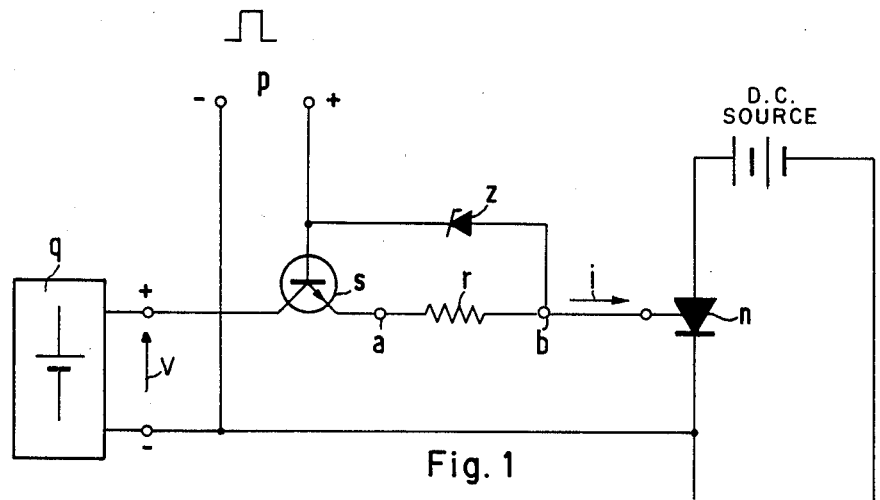
FIG. 1 shows a circuit arrangement for firing a controlled semiconductor valve, comprising an npn transistor.

According to FIG. 1, the firing energy for a controlled semiconductor valve $n$, which may be, in particular, a thyristor, is supplied from a d-c voltage source $q$. The d-c voltage V delivered may not be exactly constant. The d-c voltage source $q$ may, in particular, be one that obtains its d-c voltage V from the voltage at the anode-cathode path of the semiconductor valve $n$. Ordinarily, such a d-c voltage source is equipped with a storage capacitor. The semiconductor valve $n$ may, in particular, be laid out for high voltage and large currents and be part of a controlled converter.

The output terminals of the d-c voltage source $q$ are connected with the control path of the semiconductor valve $n$ by way of a series circuit comprising the the collector-emitter path of a transistor $s$ and a resistor $r$. An npn transistor is provided here as the transistor $s$. The latter serves here not as a switching transistor but, in conjunction with the resistor $r$, as a variable resistance. The terminals of the resistor $r$ are designated $a$ and $b$.

A Zener diode $z$ is connected between the base of the transistor $s$ and the junction point of the resistor $r$ at the control electrode of the semiconductor valve $n$. The Zener diode cathode is connected to the base. The Zener voltage is chosen relatively low in order to keep the losses of the circuit arrangement low. It may be, for instance, 3 to 5 V. The transistor $s$ is controlled by means of a control signal in the form of a voltage with rectangular wave shape. This control signal $p$ is applied between the base of the transistor $s$ and the negative output terminal of the d-c voltage source $q$ as the reference potential. Therefore, a base current with likewise rectangular wave shape flows into the base of the transistor $s$, if a purely ohmic resistor is used as the resistor $r$.

The circuit arrangement shown in FIG. 1 has the property that the control electrode current $i$, which flows into the control electrode of the semiconductor valve $n$, if a control signal $p$ different from zero is applied, is largely independent of the magnitude of the d-c voltage V and the control electrode characteristic of the semiconductor valve $n$. The circuit arrangement acts as if a constant-current source were connected to the control path of the semiconductor valve $n$. One therefore obtains a largely constant control electrode current $i$ under any operating conditions. The value of this control electrode current $i$ is chosen so that it is somewhat above that valve which is just necessary for reliable firing.

The value of the control electrode current $i$ is obtained according to the equation $$i = V(z)/R \qquad (1)$$

from the Zener voltage $V(z)$ of the Zener diode $z$ and the ohmic resistance $R$ of the resistor $r$. The Zener voltage $V(z)$ and the ohmic resistance R are chosen here in consideration of the requirement that the losses of the circuit arrangement should be as low as possible.

Circuit operates as follows. Because of the Zener diode $z$, the voltage at the series circuit consisting of the base-emitter path of the transistor $s$ and the resistor $r$ cannot exceed the Zener voltage $V(z)$. If the d-c voltage V increases, say, starting from zero, one obtains, with a control signal $p$ different from zero, which causes a base current in the transistor $s$, a slowly increasing control electrode current $i$. When the control electrode current $i$ has exceeded the value given in Eq. (1), part of the base current is shunted by way of the Zener diode $z$ to the control electrode of the valve $n$. The remaining base current flowing in the base of the transistor $s$ is reduced to the extent that the current flowing through the resistor $r$ retains the value stated in Eq. (1). The contribution of the Zener diode $z$ to the control electrode current $i$ is small.

Figure 2:
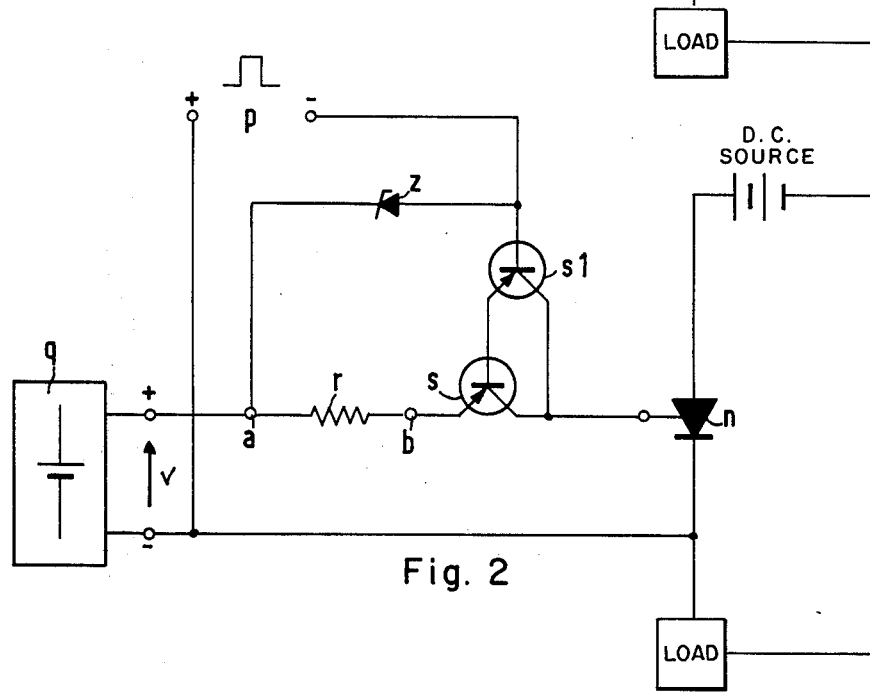
FIG. 2 shows a circuit arrangement for firing a controlled semiconductor valve, comprising two cascaded pnp transistors.

FIG. 2 shows a pnp transistor can also be used as the transistor $s$ instead of an npn transistor. Its collector is connected with the control electrode of the semiconductor valve $n$. The resistor $r$ is connected to the emitter of the transistor. The transistor $s$ is combined with a further transistor $s1$ in a cascade circuit (Darlington circuit). The Zener diode $z$ is connected between the base of the further transistor $s1$ and that terminal of the resistor $r$, which is facing away from the transistor $s$. This circuit arrangement has the advantage over that in FIG. 1 that the gain is higher and the Zener diode is loaded less.

It should further be mentioned that instead of the transistor $s$ in FIG. 1 or the transistor cascade $s$ and $s1$ in FIG. 2, any amplifier can be used which has the property to convert a variable input voltage or a variable input current into an output current proportional to the input variable. As the amplifier, a suitably connected operational amplifier can also be used here.

Figure 3:
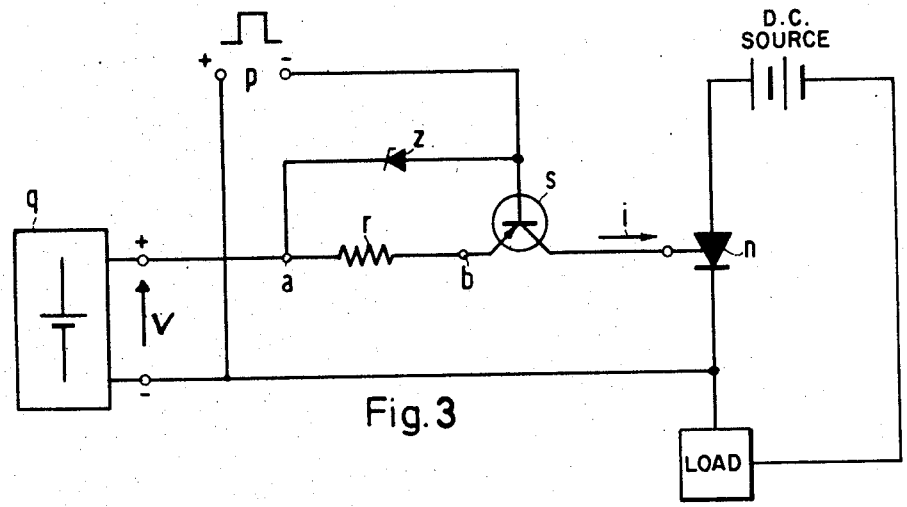
FIG. 3 shows a circuit arrangement for firing a controlled semiconductor valve, comprising a pnp transistor.

The circuit arrangement in FIG. 3 largely corresponds to that in FIG. 1. However, a pnp transistor is provided here as the transistor $s$. Here, too, the transistor $s$ does not serve as a switching transistor, but in conjunction with the resistor $r$ as a variable resistor. The terminals of the resistor are again designated $a$ and $b$.

Figure 4:
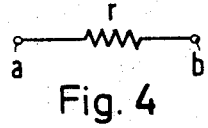
FIGS. 4, 6 and 8 show different impedances which can be arranged in series with the collector-emitter path of the transistor according to FIGS. 1 to 3.
Figure 5:
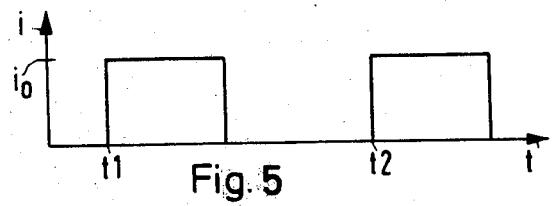
FIGS. 5, 7, and 9, show current vs. time diagrams in which the control electrode current is shaped by the impedances of FIGS. 4, 6, and 8.

Here, the Zener diode $z$ is connected between the base of the transistor $s$ and the terminal point $a$ of the resistor $r$ at the positive output terminal of the d-c voltage source $q$. Its anode is connected to the base of the transistor $s$. The Zener voltage is again chosen relatively low in order to keep the losses in the circuit arrangement low. The transistor $s$ is again controlled by means of a control signal $p$ in the form of a voltage with rectangular wave shape, which is connected between the base of the transistor $s$ and the negative output terminal of the d-c voltage source $q$ as the reference potential. Thus, there flows in the base of the transistor $s$, a base current of likewise rectangular wave shape, if a purely ohmic resistor is provided as the resistor $r$. This is shown in FIGS. 4 and 5.

The circuit arrangement shown in FIG. 3 has the same property and the same function as that in FIG. 1.

Figure 6:
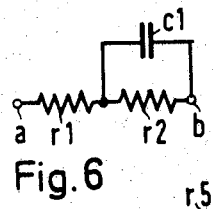

According to FIG. 6, a series connection of two ohmic resistors $r1$ and $r2$ is provided instead of the ohmic resistor $r$. Their resistances may, for instance, be 2 and 6 ohms, respectively. The ohmic resistor $r2$ is shunted by a pulse-shaping capacitor $c1$. The latter may have a capacity of 0.5 uF, for instance.

Figure 7:
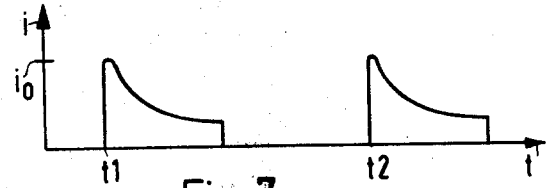

In FIG. 7, the control electrode current-versus-time diagram corresponding to FIG. 6 is plotted. From a conparison with FIG. 5 it becomes clear that the control electrode current $i$ in the firing plan $t1$, $t2$ assumes the same maximum value $i_o$, but that the control electrode current $i$ decreases rapidly. It declines to about one-third of the maximum value $i_o$. The current-time areas of the control electrode current $i$ in FIG. 7 are therefore reduced from those in FIG. 5. For each firing, less charge is therefore taken from the d-c voltage source $q$ than if a purely ohmic resistor $r$ is used.

Figure 8:
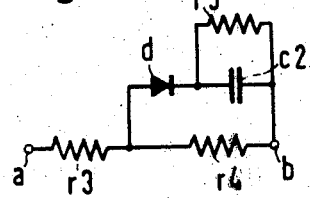

In FIG. 8, a combination of several impedances is again provided as the "resistance" $r$. Involved here are again two ohmic resistors $r3$ and $r4$, which are connected in series with each other. The resistor $r3$ may have a resistance of 2 ohms and the resistor $r4$ a resistance of 6 ohms. The resistor $r4$ is bypassed by a pulse-shaping capacitor $c2$ in series with a diode $d$ poled in the flow direction of the control electrode current $i$. This pulse-shaping capacitor $c2$ may again have the value 0.5 uf. A further ohmic resistor $r5$ is connected parallel to the pulse-shaping capacitor $c2$. The former may have a resistance of 100 ohms.

Figure 9:

In FIG. 9 the wave form of the control electrode current $i$ is plotted as a function of the time $t$ for two firings at the times $t1$ and $t2$. From this, it can be seen that the current-time area in the second firing process has become smaller than in FIG. 7. Even less charge is therefore taken from the d-c voltage source $q$ in the second firing. Firing of the semiconductor valve $n$ is nevertheless assured.

The resistances (impedances) shown in FIGS. 4, 6 and 8 are provided, in connection with the circuit arrangement in FIG. 3, particularly for the case that the semiconductor valve $n$ is fired several times during its theoretical conduction time, i.e., during the time when current conduction is desired.

The impedances shown in FIGS. 6 and 8 therefore make possible repeated firing with little energy consumption. If the d-c voltage source $q$ obtains its energy from the reverse voltage at the anode-cathode path of the semiconductor valve $n$, the reaction on the converter, of which the semiconductor valve $n$ is part, can be kept small because of the low energy requirement.

What is claimed is:

1. A circuit for controlling the firing of an electric valve comprising:
   a. a d.c. voltage source, the negative terminal of which is connected to the cathode of said electric valve;
   b. an impedance circuit comprising a first resistor in series with a second resistor and a capacitor coupled in parallel across said second resistor;
   c. a transistor having its collector emitter path connected in series with said impedance circuit between the positive terminal of said d.c. voltage source and the control electrode of said electric valve; and
   d. a zener diode connected between the base of said transistor and the terminal point of said impedance circuit which faces away from said transistor.

2. The circuit of claim 1 and further including a diode poled in the direction of said control electrode in series with said capacitor across said second resistor and a third resistor in parallel with said capacitor.

3. The circuit of claim 2 wherein the ratio of resistance of said second resistor to said first resistor is about 3:1.

4. The circuit of claim 2 wherein the ratio of resistance of said third resistor to said second resistor is about 10:1.

5. The circuit of claim 4 wherein the ratio of resistance of said second resistor to said first resistor is about 3:1.

6. The circuit of claim 1 wherein the ratio of resistance of said second resistor to said first resistor is about 3:1.

7. The circuit of claim 1 wherein the electric valve is a thyristor.

* * * * *